United States Patent
Giuffredi et al.

(10) Patent No.: US 9,941,850 B1
(45) Date of Patent: Apr. 10, 2018

(54) FULLY DIFFERENTIAL OPERATIONAL AMPLIFIER

(71) Applicant: STMICROELECTRONICS S.R.L., Agrate Brianza (IT)

(72) Inventors: Luca Giuffredi, Fidenza (IT); Andrea Boni, Reggio Emilia (IT); Marco Ronchi, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/284,150

(22) Filed: Oct. 3, 2016

(51) Int. Cl.
*H03F 3/45* (2006.01)
*H03F 1/26* (2006.01)
*H03F 1/34* (2006.01)

(52) U.S. Cl.
CPC .......... *H03F 3/45632* (2013.01); *H03F 1/26* (2013.01); *H03F 1/342* (2013.01); *H03F 2200/555* (2013.01); *H03F 2200/72* (2013.01)

(58) Field of Classification Search
CPC .................................. H03F 3/45; H03F 1/14
USPC .................................................. 330/260, 292
See application file for complete search history.

(56) References Cited

U.S. PATENT DOCUMENTS

| 6,353,361 | B1 * | 3/2002 | Sun ..................... H03F 3/45183 330/253 |
| 7,646,247 | B2 | 1/2010 | Dasgupta |

OTHER PUBLICATIONS

Dasgupta, U., "Issues in 'Abuja' Frequency Compensation Technique," 2009 IEEE International Symposium on Radio-Frequency Integration Technology, MediaTek Singapore, Singapore 139964, pp. 326-329.
Gray, P., et al., "MOS Operational Amplifier Design—A Tutorial Overview," IEEE Journal of Solid-state Circuits, vol. SC-17, No. 6, Dec. 1982, pp. 969-982.
Quinn, P. J., et al., "Switched-Capacitor Techniques for High-Accuracy Filter and ADC Design," Springer, 2007, pp. 55-70. (19 pages).

* cited by examiner

*Primary Examiner* — Steven J Mottola
(74) *Attorney, Agent, or Firm* — Seed IP Law Group LLP

(57) ABSTRACT

A fully differential operational amplifier is provided. The amplifier has input nodes and includes a differential input stage for receiving input signals over the input nodes and providing output signals on first and second intermediary nodes. The amplifier includes a fully differential amplification stage having positive and negative inputs coupled to the first and second intermediary nodes, respectively. The amplifier includes a first compensation transistor having conduction terminals coupled to the first intermediary node and a first node, and a control terminal coupled to a negative output of the fully differential amplification stage. The amplifier includes a second compensation transistor having conduction terminals coupled to the second intermediary node and a second node, and a control terminal coupled to a positive output of the fully differential amplification stage. The amplifier includes positive and negative output stages for providing amplifier outputs and feeding the outputs back to the amplifier.

25 Claims, 5 Drawing Sheets

FULLY DIFFERENTIAL OPERATIONAL AMPLIFIER

BACKGROUND

Technical Field

This application is directed to a fully differential operational amplifier. In particular, this application is directed to a fully differential operational amplifier that has a fully differential topology and that operates in a low power supply range of 1.2 Volts (V) or lower.

Description of the Related Art

Conventional techniques for stabilizing amplifiers and performing frequency compensation include Miller compensation, Ahuja compensation and DasGupta compensation. Miller compensation (described in P. R. Gray and R. G. Meyer, MOS Operational Amplifier Design—A Tutorial Overview, *IEEE Journal of Solid-State Circuits*, Vol. 17, No. 6, pp. 969-982, December 1982) places a compensation capacitor between the outputs of two stages of an operational amplifier. The Miller compensation stabilizes the amplifier by separating the dominant poles due to parasitic capacitance at the output of first and second stage. Nevertheless, the compensation capacitance (Cc) also introduces an undesired direct propagation path to the output without inversion of phase. The right half-plane zero (z) may affect the frequency stability.

Ahuja compensation (described in DasGupta, U., "Issues in Ahuja frequency compensation technique," *Radio-Frequency Integration Technology*, 2009) cancels the effect of the right plane root and reduces the size of the compensation capacitor. As a result, Ahuja-compensated amplifiers are better suited for relatively high resistive and relatively high capacitive loading. Ahuja compensation introduces a common gate amplifier in series with the Miller compensation capacitor. The common gate amplifier uses a current generator that is biased using an external reference voltage. The current generator adds noise in the Ahuja-compensated amplifier. Generation of the external reference voltages introduces additional noise in the Ahuja-compensated amplifier.

DasGupta compensation (described in U.S. Pat. No. 7,646,247) attempts to improve the Ahuja compensation using a folded cascode configuration as a first amplifier stage. The folded cascode configuration requires two current generators that need to be biased using external reference voltages. The current generators add noise in the Dasgupta-compensated amplifier. Generation of the external reference voltages introduces additional noise in the DasGupta-compensated amplifier. The DasGupta compensation also introduces two single ended amplifiers in the amplifier topology.

It is desirable to have a fully differential operational amplifier that can operate in a low voltage environment. It is also desirable for the fully differential operational amplifier to be able to reject noise, thus avoiding additional noise introduced in the Ahuja and in the Dasgupta-compensated amplifiers.

BRIEF SUMMARY

In an embodiment, a fully differential operational amplifier includes first and second amplifier input nodes and first and second amplifier output nodes. The fully differential operational amplifier includes a differential input stage having a first input coupled to the first amplifier input node, a second input coupled to the second amplifier input node, a first output coupled to a first intermediary node and a second output coupled to a second intermediary node. The fully differential operational amplifier includes a level shifting and amplification stage having first and second outputs.

The level shifting and amplification stage includes a fully differential amplification stage having a positive input coupled to the first intermediary node, a negative input coupled to the second intermediary node, a negative output, and a positive output. The level shifting and amplification stage also includes a first compensation transistor having a first conduction terminal coupled to the first intermediary node, a second conduction terminal coupled to the first output of the level shifting and amplification stage, and a control terminal coupled to the negative output of the fully differential amplification stage. The level shifting and amplification stage includes a second compensation transistor having a first conduction terminal coupled to the second intermediary node, a second conduction terminal coupled to the second output of the level shifting and amplification stage, and a control terminal coupled to the positive output of the fully differential amplification stage.

The fully differential operational amplifier includes a positive output stage having an input coupled to first output of the level shifting and amplification stage, and an output coupled to the first amplifier output node, and a negative output stage having an input coupled to the first output of the level shifting and amplification stage and an output coupled to the second amplifier output node.

In an embodiment, a fully differential operational amplifier includes a differential input stage having first and second inputs coupled to a positive voltage input node and a negative voltage input node of the fully differential operational amplifier, respectively, and first and second outputs. The fully differential operational amplifier includes an amplification stage having first and second inputs coupled to the first and second outputs of the differential input stage, respectively, and first and second outputs. The fully differential operational amplifier includes a first compensation transistor having a first conduction terminal coupled to the first input of the amplification stage, a control terminal coupled the first output of the amplification stage, and a second conduction terminal. The fully differential operational amplifier includes a second compensation transistor having a first conduction terminal coupled to the second input of the amplification stage, a control terminal coupled the second output of the amplification stage, and a second conduction terminal.

In an embodiment, a method includes receiving, by a differential input stage of a differential operational amplifier, a first input signal and a second input signal, and outputting, by the differential input stage, a first intermediary signal and a second intermediary signal based on the first and second input signals. The method includes outputting, by a first and second output stages, a first and second output signals of the differential operational amplifier. The method includes feeding back, by a first and second compensating capacitors, respectively, third and fourth intermediary signals based on the first and second output signals of the differential operational amplifier, respectively. The method includes outputting, by an auxiliary operational amplifier, first and second control signals based on the first, second, third and fourth intermediary signals. The method includes controlling, using the first and second control signals, the first and second output stages of the differential operational amplifier, respectively.

DETAILED DESCRIPTION

Figure 1:
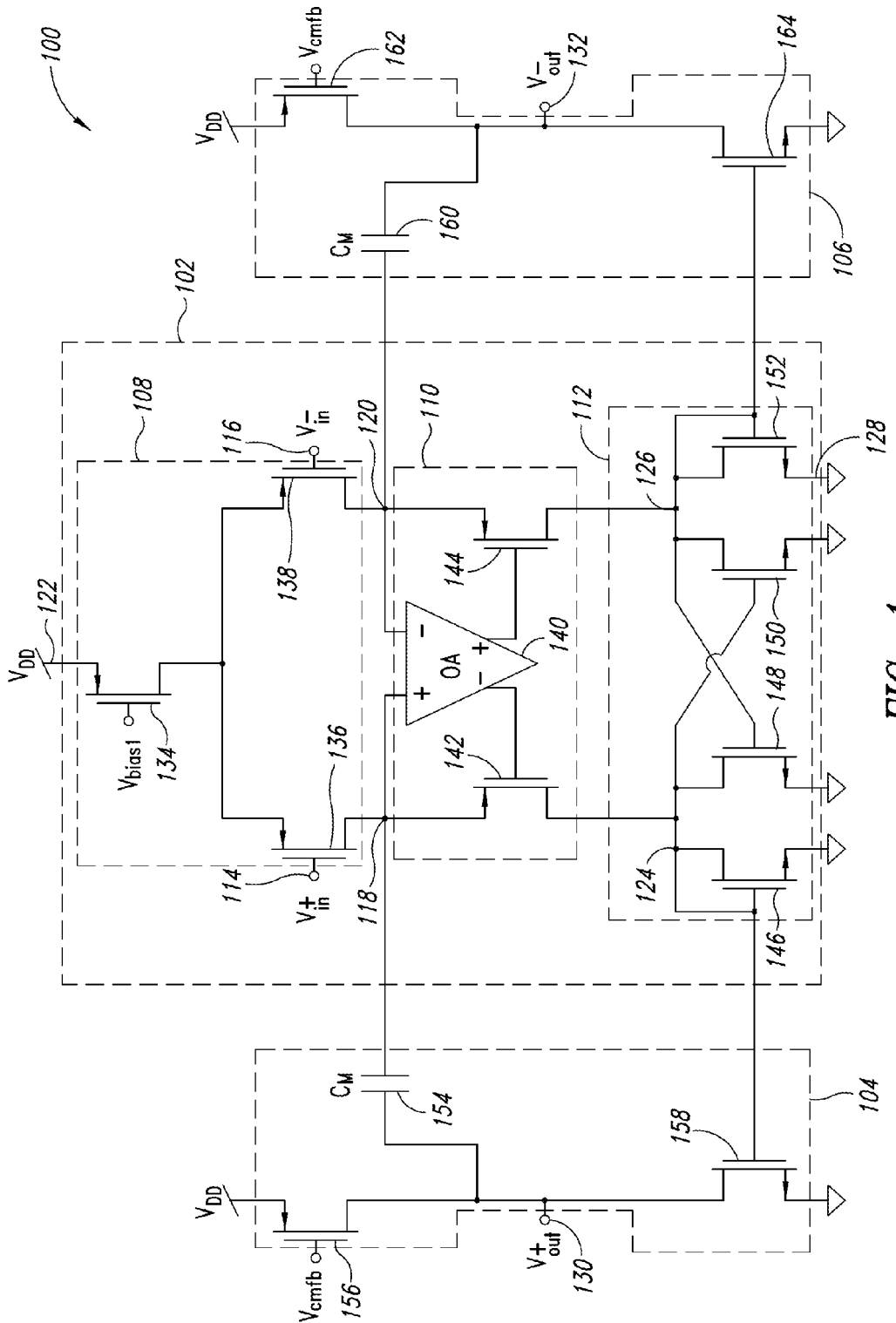
FIG. 1 shows a schematic of a fully differential operational amplifier.

FIG. 1 shows a schematic of a fully differential operational amplifier 100. The fully differential operational amplifier 100 includes an input stage 102, a positive output stage 104 and a negative output stage 106. The input stage 102 includes a differential input stage 108, a common gate amplifier stage with level shifting and amplification stage 110 and a gain stage 112.

The differential input stage 108 is coupled between a positive voltage input node 114 and a negative voltage input node 116 and first and second intermediary nodes 118, 120. The differential input stage 108 is also coupled to a voltage source node 122 that provides a supply voltage $V_{DD}$. The positive voltage input node 114 receives a first input signal $V_{in}^+$ and the negative voltage input node 116 receives a second input signal $V_{in}^-$.

The level shifting and amplification stage 110 has a first input coupled to the first intermediary node 118 and a second input coupled to the second intermediary node 120. The level shifting and amplification stage 110 has a first output coupled to a positive voltage output node 124 and a second output coupled to a negative voltage output node 126. The gain stage 112 is coupled between the positive voltage output node 124, the negative voltage output node 126, and a ground node 128.

The positive output stage 104 is coupled between the first intermediary node 118 and the positive voltage output node 124 at its input, and an amplifier positive voltage output node 130 at its output. The positive output stage 104 is also coupled to the voltage source node 122 and the ground node 128. Similarly, the negative output stage 106 is coupled between the second intermediary node 120 and the negative voltage output node 126 at its input, and an amplifier negative voltage output node 132 at its output.

The differential input stage 108 includes a current source transistor 134 and first and second differential input transistors 136, 138. The current source transistor 134 has a source coupled to the voltage source node 122, a gate for receiving a bias voltage $V_{bias1}$, and a drain. The first differential input transistor 136 has a source coupled to the drain of the current source transistor 134, a gate coupled to the positive voltage input node 114, and a drain coupled to the first intermediary node 118. The second differential input transistor 138 has a source coupled to the drain of the current source transistor 134, a gate coupled to the negative voltage input node 116, and a drain coupled to the second intermediary node 120.

The level shifting and amplification stage 110 has a fully differential, auxiliary operational amplifier 140 and first and second compensation transistors 142, 144. The auxiliary operational amplifier 140 has a positive input coupled to the first intermediary node 118 and a negative input coupled to the second intermediary node 120. The auxiliary operational amplifier 140 also includes a negative output coupled to a gate of the first compensation transistor 142 and a positive output coupled to a gate of the second transistor 144. A source of the first compensation transistor 142 is coupled to the first intermediary node 118, and a drain of the first compensation transistor 142 is coupled to the positive voltage output node 124. A source of the second compensation transistor 144 is coupled to the second intermediary node 120, and a drain of the second compensation transistor 144 is coupled to the negative voltage output node 126.

The gain stage 112 comprises first, second, third, and fourth feedback transistors 146, 148, 150, 152. The first feedback transistor 146 has a drain and gate that are both coupled to the positive voltage output node 124, and has a source that is coupled to the ground node 128. The second feedback transistor 148 has a drain coupled to the positive voltage output node 124, a gate coupled to the negative voltage output node 126, and a drain coupled to the ground node 128. The third feedback transistor 150 has a drain coupled to the negative voltage output node 126, a gate coupled to the positive voltage output node 124, and a source coupled to the ground node 128. The fourth feedback transistor 152 has both a drain and gate coupled to the negative voltage output node 126, and a source coupled to the ground node 128.

The positive output stage 104 comprises a first compensating capacitor 154, first current source transistor 156, and first voltage gain transistor 158. The first compensating capacitor 154 is coupled between the first intermediary node 118 and the positive voltage output node 130. The first current source transistor 156 has a source coupled to the voltage source node 122, a gate for receiving a common mode feedback voltage $V_{cmfb}$, and a drain coupled to the positive voltage output node 130. The first voltage gain transistor 158 has a drain coupled to the positive voltage output node 130, a gate coupled to the positive voltage output node 124, and a source coupled to the ground node 128.

The negative output stage 106 includes a second compensating capacitor 160, second current source transistor 162, and second voltage gain transistor 164. The second compensating capacitor 160 is coupled between the second intermediary node 120 and the amplifier negative voltage output node 132, a source coupled to the voltage source node 122, and a drain coupled to the amplifier negative voltage output node 132. The second current source transistor 162 has a gate that receives the common mode feedback voltage, a source coupled to the voltage source node 122, and a drain coupled to the negative voltage output node 132. The second voltage gain transistor 164 has a drain coupled to the amplifier negative voltage output node 132, a source coupled to the ground node 128, and a gate coupled to the negative voltage output node 126.

The input stage 102 of the fully differential operational amplifier 100 has a fully differential topology. The fully differential topology of the input stage 102 rejects common mode interference as described herein. The symmetric coupling of the positive output stage 104 and the negative output stage 106 to the input stage 102 makes the fully differential operational amplifier 100 have a fully differential topology.

The first compensating capacitor 154 and the second compensating capacitor 160 implement Miller compensation in the fully differential operational amplifier 100. The first compensating capacitor 154 is coupled between the input (the positive voltage output node 124) and the output (the amplifier positive voltage output node 130) of the positive output stage 104. The second compensating capacitor 160 is coupled between the input (negative voltage output node 126) and the output (amplifier negative voltage output node 132) of the negative output stage 106.

The first compensating capacitor 154 improves the response of the fully differential operational amplifier 100 because the first compensating capacitor 154 feeds back the output ($V^+_{OUT}$) of the positive output stage 104 at the amplifier positive voltage output node 130 to the level shifting and amplification stage 110. The output of the positive output stage 104 is feedback to the input of the level shifting and amplification stage 110. Similarly, the second compensating capacitor 160 feeds back the output ($V^-_{OUT}$) of the negative output stage 106 at the amplifier negative voltage output node 132 to the level shifting and amplification stage 110.

The level shifting and amplification stage 110 implements an Ahuja-type compensation in the fully differential operational amplifier 100. To implement the Ahuja-type compensation, the first compensation transistor 142 is coupled in series with the first compensating capacitor 154 for the positive output stage 104. For the negative output stage 106, the second compensating transistor 144 is coupled in series with the second compensating capacitor 160. The first and second compensating transistors 142, 144 are both common-gate.

The Ahuja-type compensation is performed while maintaining the fully differential topology of the fully differential operational amplifier 100 and without using a folded cascode architecture. Furthermore, the compensation is performed by the level shifting and amplification stage 110 without including current generating transistors with external biasing, which would introduce noise in the fully differential operational amplifier 100.

The level shifting and amplification stage 110 includes first and second compensation transistors 142, 144, which are common gate transistors respectively driven by the positive and negative outputs of the auxiliary operational amplifier 140. The first compensation transistor 142, which is coupled between the first intermediary node 118 and the positive voltage output node 124, is in the signal path of the first compensating capacitor 154. The auxiliary operational amplifier 140 provides the gate bias to the first compensation transistor 142 and alleviates the need for using a common gate amplifier biased by an external reference signal as was done in the DasGupta architecture. Further, use of the level shifting and amplification stage 110 alleviates the need for using a single-ended amplifier for driving the first compensation transistor 142.

The second compensation transistor 144, which is coupled between the second intermediary node 120 and the negative voltage output node 126, is in the signal path of the second compensating capacitor 160. The auxiliary operational amplifier 140 provides, at its positive output, the gate bias to the second compensation transistor 144 and alleviates the need for using a common gate amplifier biased by an external reference signal as was done in the DasGupta architecture. Further, use of the level shifting and amplification stage 110 alleviates the need for using a single-ended amplifier for driving the second compensation transistor 144.

The gain stage 112 provides a local positive feedback for the fully differential operational amplifier 100. The positive feedback increases the output resistance as well as the voltage gain of the input stage 102. It is also noted that the fully differential operational amplifiers described herein are shown to include the gain stage 112, which may be removed. For example, transistors 148 and 150 may be removed if the local positive feedback is not desired or needed or if the achieved gain does not justify the cost of adding the local positive feedback to the gain stage 112. Utilization of local positive feedback is described in P. J. Quinn and A. van Roermund, *Switched-Capacitor Techniques for High-Accuracy Filter and ADC Design*, Analog Circuits and Signal Processing Series, Springer, July 2007.

A low-power amplifier may operate using a supply voltage of 1V of less. n-channel complementary metal-oxide-semiconductor (CMOS) devices (denoted 'MN') and p-channel CMOS devices (denoted 'MP') typically have a voltage threshold of 0.5V to 0.6V. If the supply voltage is lower than the threshold, the CMOS devices may be turned off. In low-power devices, if a modest or a large number of CMOS devices are stacked, the requisite supply voltage may not be reached for some devices in the stack. The fully differential operational amplifier 100 is advantageous in that it includes a relatively small number of stacked transistors. Thus, operability of the CMOS device is achieved across the stack in low voltage environments.

Figure 2:
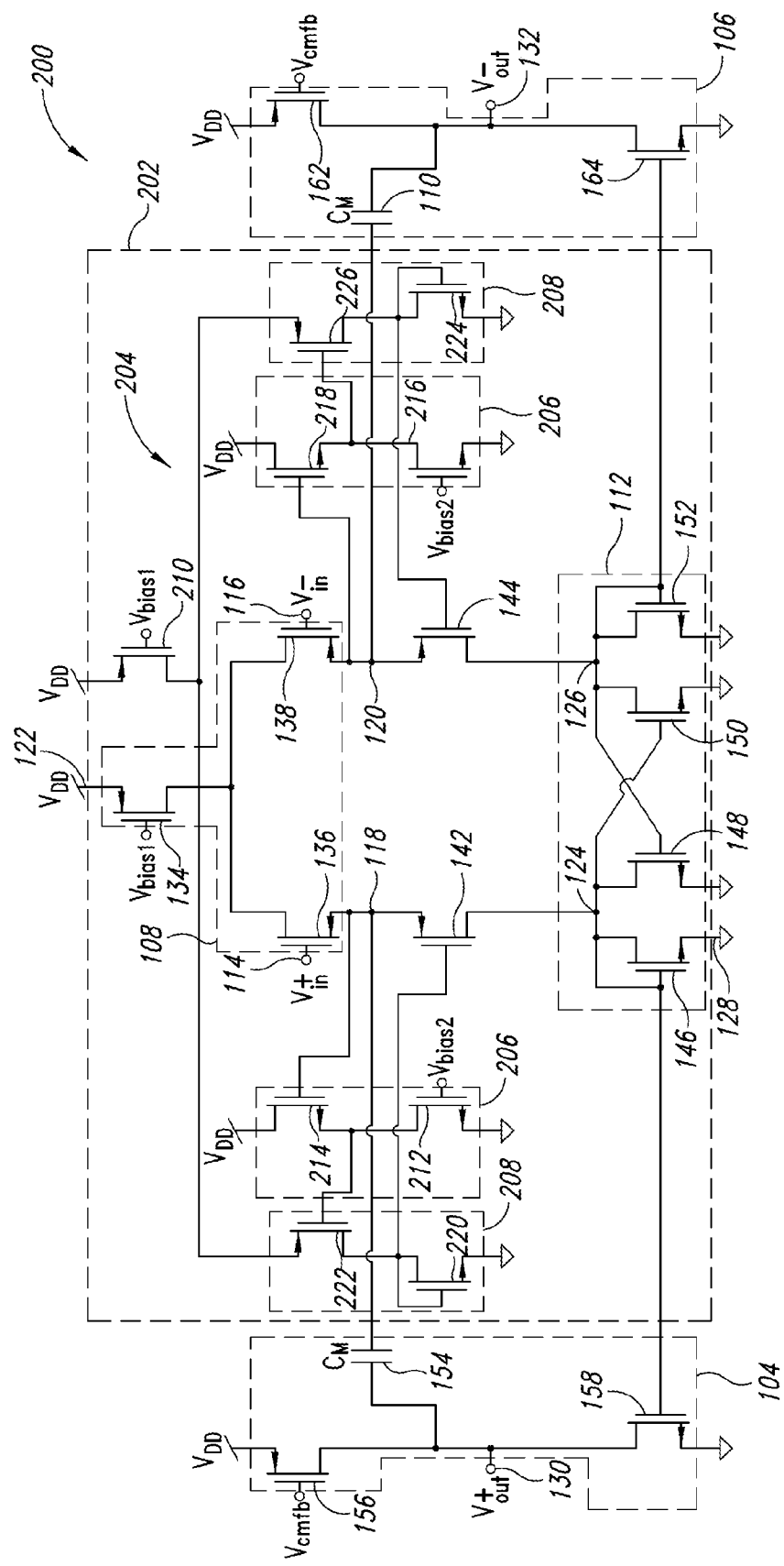
FIG. 2 shows a schematic of a fully differential operational amplifier in accordance with at least one embodiment.

FIG. 2 shows a schematic of a fully differential operational amplifier 200 in accordance with at least one embodiment. Elements of the fully differential operational amplifier 200 similar to those of the fully differential operational amplifier 100 described with reference to FIG. 1 have the same reference numerals. An example of the architecture of the auxiliary operational amplifier 140 is expanded and shown in FIG. 2. The auxiliary operational amplifier 140 comprises a current source transistor 210, a level shifting stage 206 and an amplification stage 208.

The fully differential operational amplifier 200 includes an input stage 202, the positive output stage 104, and the negative output stage 106. The input stage 202 includes the differential input stage 108, a compensation stage 204, and the gain stage 112. The compensation stage 204 includes the first and second compensation transistors 142, 144 and the current source transistor 210, level shifting stage 206 and amplification stage 208 of the auxiliary operational amplifier.

The differential input stage 108 has a first input coupled to the positive voltage input node 114 and a second input coupled to the negative voltage input node 116. The differential input stage 108 has a first output coupled to the first intermediary node 118 and a second output coupled to the second intermediary node 120. The differential input stage 108 is also coupled to the voltage source node 122. The level shifting stage 206 is coupled to the first and second intermediary nodes 118, 120 and the amplification stage 208. The level shifting stage 206 is also coupled to the voltage source node 122 and the ground node 128. The level shifting stage 206 additionally receives a bias voltage $V_{bias2}$.

The amplification stage 208 is coupled to the current source transistor 210, the level shifting stage 206, and the first and second compensation transistors 142, 144. The amplification stage 208 is also coupled to the ground node 128.

The first amplification transistor 142 has a source coupled to the first intermediary node 118, a drain coupled to the positive voltage output node 124, and a gate coupled to an output of the amplification stage 208. The second amplification transistor 144 has a source coupled to the second intermediary node 120, a drain coupled to the negative voltage output node 126, and a gate coupled to the amplification stage 208. The current source transistor 210 has a source coupled to the voltage source node 122, a drain coupled to the output of the amplification stage 208, and a gate that receives a bias voltage.

The level shifting stage 206 includes first, second, third, and fourth level shifting transistors 212, 214, 216, 218. The amplification stage 208 includes first, second, third, and fourth amplification transistors 220, 222, 224, 226.

The first level shifting transistor 212 has a drain coupled to the source of the second level shifting transistor 214, a source coupled to the ground node 128, and a gate that receives a bias voltage. The second level shifting transistor 214 has a drain coupled to the voltage source node 122 and a gate coupled to the first intermediary node 118.

The third level shifting transistor 216 has a drain coupled to the source of the fourth level shifting transistor 218, a source coupled to the ground node 128, and a gate that receives a bias voltage. The fourth level shifting transistor 218 has a drain coupled to the voltage source node 122 and a gate coupled to the second intermediary node 120.

The first amplification transistor 220 has a drain and gate that are coupled to one another and to the gate of the first compensation transistor 142. The first amplification transistor 220 has a source coupled to the ground node 128. The second amplification transistor 222 has a source coupled to the drain of the current source transistor 210, a drain coupled to the gate of the first compensation transistor 142, and a gate coupled to the source of the second level shifting transistor 214.

The third amplification transistor 224 has a drain and gate that are coupled to one another and to the gate of the second compensation transistor 144. The third amplification transistor 224 has a source coupled to the ground node 128. The fourth amplification transistor 226 has a source coupled to the drain of the current source transistor 210, a drain coupled to the gate of the second compensation transistor 144, and a gate coupled to the source of the fourth level shifting transistor 218.

In the level shifting stage 206, the first and second level shifting transistors 212, 214 form a level shifter for a signal at the first intermediary node 118. The level shifter, which is a common gain in amplifier, provides a voltage gain of about one. Similarly, the third and fourth level shifting transistors 216, 218 form a level shifter for a signal at the second intermediary node 120.

The current source transistor 210 and the first, second, third, and fourth amplification transistors 220, 222, 224, 226 of the amplification stage 208 form a differential amplifier. The amplification transistors 220, 222, 224, 226 are biased by the current source transistor 210. Common feedback control is not necessary for the first and third amplification transistors 220, 224. This simplifies the implementation of the auxiliary differential amplifier.

It is noted that the current source transistor 210 is biased in the weak inversion region in order to achieve a low drain-to-source saturation voltage. Biasing the current source transistor 210 in such a manner is done in order to operate the fully differential operational amplifier 200 with a relatively low supply voltage (for example, between 1 and 1.2V). The biasing results in generating a relatively high noise level. However, the noise generated by the current source transistor 210 is rejected by the common mode structure of the fully differential operational amplifier 200.

Furthermore, the first and third level shifting transistors 212, 216 are driven by a bias voltage. Noise generated by the first and third level shifting transistors 212, 216 is applied to the gate of the first and second compensation transistors 142, 144, respectively. The first and second compensation transistors 142, 144 are configured as common-gate amplifiers biased by a current generator and, therefore, they exhibit a negligible voltage gain from their gate to their drain. The noise voltage due to the first and third level shifting transistors 212, 216 is, therefore, not transferred to the drains of the first and second compensation transistors 142, 144, i.e. to the outputs of the input stage 202. For the same reason the noise generated within the transistors 142, 144 is not transferred to the outputs of the input stage 202. Furthermore, the noise generated by the current generator biasing transistors 142, 144 is canceled at the output of the input stage 202 since it is a common-mode noise. Indeed, transistors 142 and 144 share the same current generator consisting in transistor 134 biased by an external voltage reference.

Figure 3:
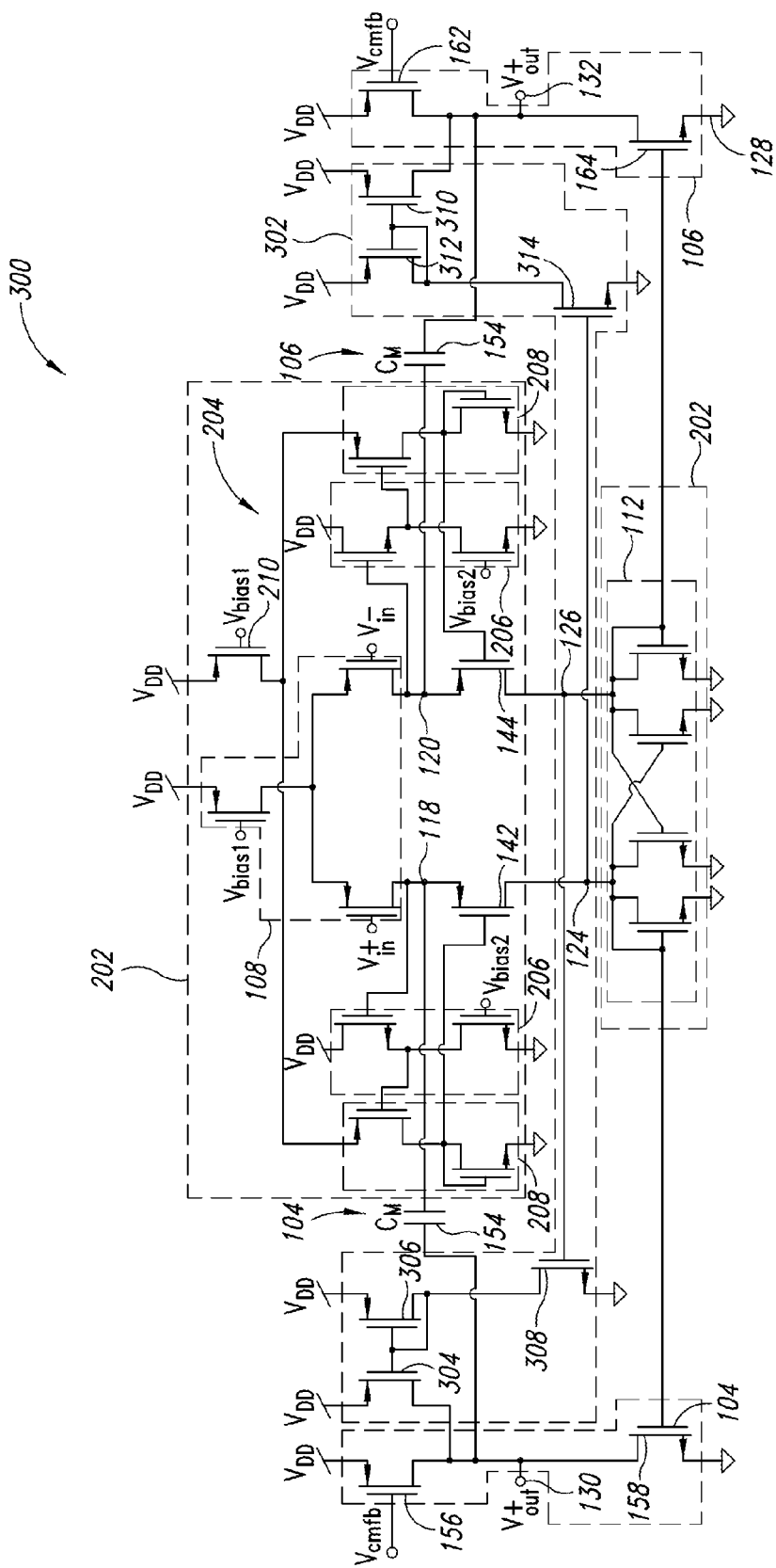
FIG. 3 shows a schematic of a class AB fully differential operational amplifier in accordance with at least one embodiment.

The fully differential operational amplifier 100 described with reference to FIG. 1 is a class A amplifier, whereas the fully differential operational amplifier 200 described with reference to FIG. 2 is an implementation of the class A amplifier described with reference to FIG. 1. Class A amplifiers are biased with a constant current. FIG. 3 is a class AB implementation of the fully differential operational amplifier 100, where the amplifier is additionally biased with a varying current.

FIG. 3 shows a schematic of a class AB fully differential operational amplifier 300 in accordance with at least one embodiment. Similar elements of the fully differential operational amplifier 300 as those of the fully differential operational amplifier 200 described with reference to FIG. 2 have the same reference numerals.

The fully differential operational amplifier 300 includes an input stage 202, positive and negative output stages 104, 106, and a biasing stage 302. The input stage 202 has a similar architecture as that the fully differential operational amplifier 200 described with reference to FIG. 2. The positive and negative output stages 104, 106 also have a similar architecture as that of the fully differential operational amplifier 200 described with reference to FIG. 2. However, the positive and negative output stages 104, 106 are also coupled, at their inputs, to an output of the biasing stage 302. The biasing stage 302, on the other hand, is coupled, at its input, to the positive voltage output node 124 and the negative voltage output node 126. The biasing stage 302 is also coupled at its input to the voltage source node 122.

The biasing stage 302 includes first, second, and third positive biasing transistors 304, 306, 308 and first, second, and third negative biasing transistors 310, 312, 314. The first positive biasing transistor 304 has a source coupled to the voltage source node 122, a drain coupled to the amplifier positive voltage output node 130, and a gate coupled to both the gate of the second positive biasing transistor 306 and the drain of the third positive biasing transistor 308. The second positive biasing transistor 306 has a source coupled to the voltage source node 122. The drain and gate of the second positive biasing transistor 306 are coupled to one another and to the drain of the third positive biasing transistor 308. The third positive biasing transistor 308 has a source coupled to the ground node 128 and a gate coupled to the negative voltage output node 126.

The first negative biasing transistor 310 has a source coupled to the voltage source node 122 and a drain coupled to the amplifier negative voltage output node 132. The gate of the first negative biasing transistor 310 is coupled to the gate and the drain of the second negative biasing transistor 312. The second negative biasing transistor 312 has a source coupled to the voltage source node 122. The gate and drain of the second negative biasing transistor 312 are coupled to one another and also to the drain of the third negative biasing transistor 314. The third negative biasing transistor 314 has a source coupled to the ground node 128 and a gate coupled to the positive voltage output node 124.

The biasing stage 302 provides the class AB fully differential operational amplifier 300 a biasing current that varies with voltage. In contrast, the class A fully differential operational amplifiers 100, 200 are biased with a constant current rather than a varying current.

In the positive output stage 104, the biasing current of the first voltage gain transistor 158 is provided by both the first current source transistor 156 and the first positive biasing transistor 304. The first current source transistor 156 provides a constant current to the first voltage gain transistor 158. The first positive biasing transistor 304 provides a current that depends on the voltage at the negative voltage output node 126. For example, to transition the output voltage at the amplifier positive voltage output node 130 from a low level to a high level, the first positive biasing transistor 304 provides additional current. Thus, the bias current is dynamically adjusted based on the target output voltage.

Class A and class AB operational amplifiers have different power consumption characteristics. The class A operational amplifier has a relatively constant power consumption regardless of whether an input signal is received. The power consumption of the class AB operational amplifier rises when an input signal is received and drops in the absence of an input signal.

Figure 4:
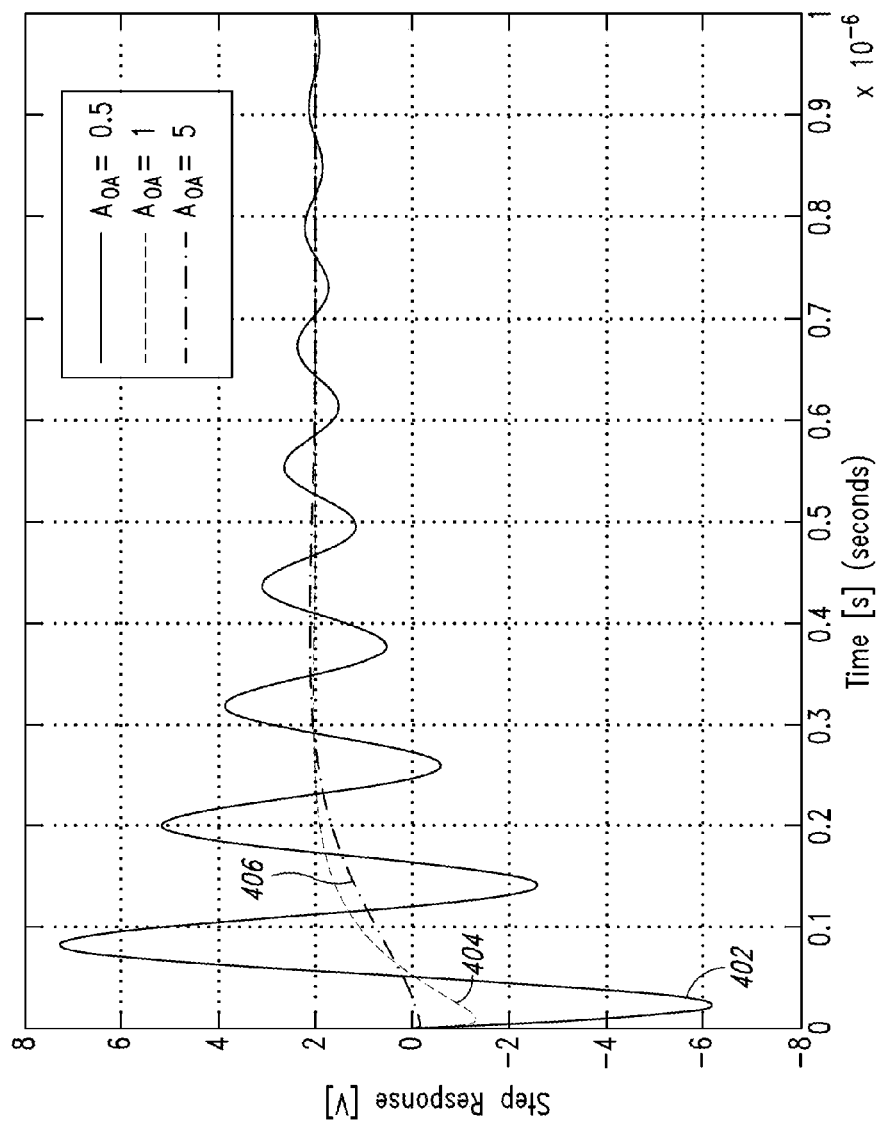
FIG. 4 shows a step response of the auxiliary operational amplifier of the fully differential operational amplifier for various gain levels.

FIG. 4 shows a step response of the auxiliary operational amplifier 140 for various gain levels. The gain of the auxiliary operational amplifier 140 affects the closed-loop transfer function of the fully differential operational amplifier 100. Because the frequency response of the auxiliary operational amplifier 140 is closely linked to its step response, operating at an optimal gain results in maximizing the stability of the amplifier 100 in closed-loop configuration. As shown in FIG. 4, a gain of value of one (line 404) provides better stability than a gain of 0.5 (line 402) or a gain of 5 (line 406).

Figure 5:
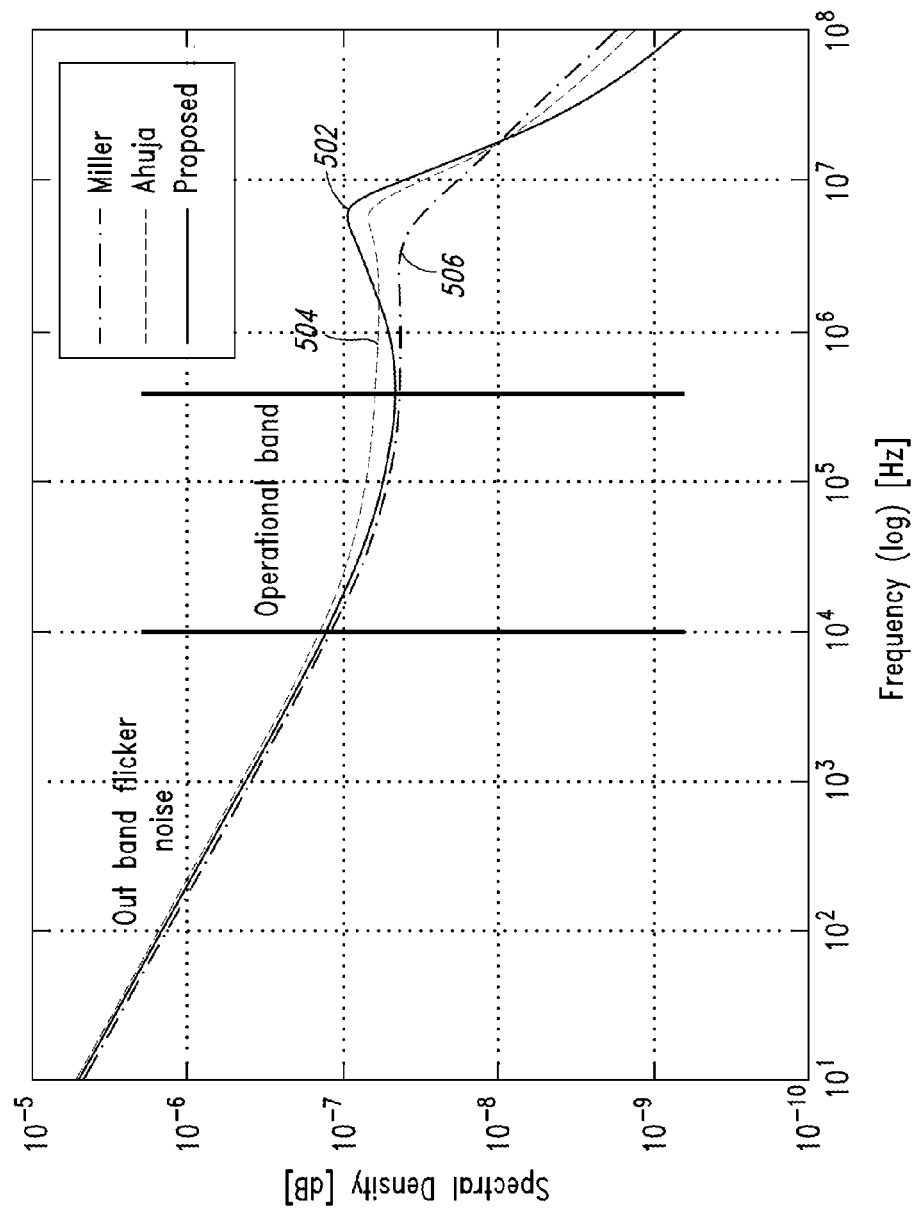
FIG. 5 shows a comparison between the noise spectral density of the fully differential operational amplifier, an Ahuja-compensated amplifier and a Miller-compensated amplifier.

FIG. 5 shows a comparison between the noise spectral density of the fully differential operational amplifier 100, an Ahuja-compensated amplifier and a Miller-compensated amplifier. The noise spectral density of the fully differential operational amplifier 100 (line 502) is represented as:

$$\overline{v_{in}^2} \approx 2\frac{4kT\gamma}{g_{m3}}\left[1 + \frac{g_{m5}+g_{m7}}{g_{m3}} + \frac{(g_{m5}-g_{m7})^2}{g_{m3}g_{m9}} + \frac{g_{m11}}{g_{m9}^2}\cdot\frac{(g_{m5}-g_{m7})^2}{g_{m3}}\right].$$

Equation (1)

The noise spectral density of the Ahuja-compensated amplifier (line 504) is represented as:

$$\overline{v_{in}^2} \approx 2\frac{4kT\gamma}{g_{m3}}\left[1 + \frac{g_{m5}+g_{m7}}{g_{m3}} + \frac{(g_{m5}-g_{m7})^2}{g_{m3}g_{m9}} + \frac{g_{m11}}{g_{m9}^2}\cdot\frac{(g_{m5}-g_{m7})^2}{g_{m3}} + \frac{g_{m21}}{g_{m3}}\right],$$

Equation (2)

and the noise spectral density of the Miller-compensated amplifier (line 506) is represented as:

$$\overline{v_{in}^2} \approx 2\frac{4kT\gamma}{g_{m3}}\left[1 + \frac{g_{m5}+g_{m7}}{g_{m3}} + \frac{(g_{m5}-g_{m7})^2}{g_{m3}g_{m9}} + \frac{g_{m11}}{g_{m9}^2}\cdot\frac{(g_{m5}-g_{m7})^2}{g_{m3}}\right].$$

Equation (3)

The fully differential operational amplifier 100 has a comparable spectral density for noise as the Miller-compensated amplifier. Further, due to the term $$\frac{g_{m21}}{g_{m3}}$$

in Equation (3), the noise spectral density of the fully differential operational amplifier 100 is lower than that of the Ahuja-compensated amplifier.

As shown in FIG. 5, in the operational band between 10 kilohertz (kHz) and 400 kHz, the noise spectral density of the fully differential operational amplifier 100 is lower than that of the Ahuja-compensated amplifier and comparable to that of the Miller-compensated amplifier.

The fully differential operational amplifier 100 offers better noise performance than the Ahuja-compensated amplifier and a comparable noise performance as the Miller-compensated amplifier while offering improved low-power operation and a fully differential topology that rejects common mode noise.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A fully differential operational amplifier, comprising:
first and second amplifier input nodes;
first and second amplifier output nodes;
a differential input stage having a first input coupled to the first amplifier input node, a second input coupled to the second amplifier input node, a first output coupled to a first intermediary node and a second output coupled to a second intermediary node;
a level shifting and amplification stage having first and second outputs, the level shifting and amplification stage including:
  a fully differential amplification stage having a positive input coupled to the first intermediary node, a negative input coupled to the second intermediary node, a negative output, and a positive output;
  a first compensation transistor having a first conduction terminal coupled to the first intermediary node, a second conduction terminal coupled to the first output of the level shifting and amplification stage, and a control terminal coupled to the negative output of the fully differential amplification stage; and
  a second compensation transistor having a first conduction terminal coupled to the second intermediary node, a second conduction terminal coupled to the second output of the level shifting and amplification stage, and a control terminal coupled to the positive output of the fully differential amplification stage;

a positive output stage having an input coupled to first output of the level shifting and amplification stage, and an output coupled to the first amplifier output node, the positive output stage including a first compensating capacitor coupled between the first amplifier output node and the positive input of the fully differential amplification stage at the first intermediary node; and a negative output stage having an input coupled to the first output of the level shifting and amplification stage and an output coupled to the second amplifier output node, the negative output stage including a second compensating capacitor coupled between the second amplifier output node and the negative input of the fully differential amplification stage at the second intermediary node.

2. The fully differential operational amplifier of claim 1, wherein the fully differential amplification stage includes:
   a level shifting stage having, as inputs, the positive input and the negative input of the fully differential amplification stage, the level shifting stage having a first output, and a second output;
   an amplification stage having a first input coupled to the first output of the level shifting stage, and a second input coupled to the second output of the level shifting stage, the amplification stage having, as outputs, the negative output and the positive output of the fully differential amplification stage.

3. The fully differential operational amplifier of claim 2, wherein the level shifting stage includes:
   a first level shifting transistor having a first conduction terminal coupled to a power supply node, a control terminal coupled to the first intermediary node, and a second conduction terminal; and
   a second level shifting transistor having a first conduction terminal coupled to the second conduction terminal of the first level shifting transistor, a control terminal for receiving a bias voltage, and a second conduction terminal coupled to a ground node.

4. The fully differential operational amplifier of claim 3, wherein the amplification stage includes:
   a first amplification transistor having a first conduction terminal for receiving a current, a control terminal coupled to the second conduction terminal of the first level shifting transistor, and a second conduction terminal coupled to the control terminal of the first compensation transistor; and
   a second amplification transistor having a first conduction terminal and a control terminal that are both coupled to the control terminal of the first compensation transistor, and a second conduction terminal coupled to a ground node.

5. The fully differential operational amplifier of claim 2, wherein the level shifting stage includes:
   a third level shifting transistor having a first conduction terminal coupled to a power supply node, a control terminal coupled to the second intermediary node, and a second conduction terminal; and
   a fourth level shifting transistor having a first conduction terminal coupled to the second conduction terminal of the third level shifting transistor, a control terminal for receiving a bias voltage, and a second conduction terminal coupled to a ground node.

6. The fully differential operational amplifier of claim 5, wherein the amplification stage includes:

a third amplification transistor having a first conduction terminal for receiving a current, a control terminal coupled to the second conduction terminal of the third level shifting transistor, and a second conduction terminal coupled to the control terminal of the second compensation transistor; and a fourth amplification transistor having a first conduction terminal and a control terminal that are both coupled to the control terminal of the second compensation transistor, and a second conduction terminal coupled to a ground node.

7. The fully differential operational amplifier of claim 1, wherein the positive output stage includes:
   a first current source transistor having a first conduction terminal coupled to a voltage source node, a control terminal for receiving a common mode feedback voltage, and a second conduction terminal coupled to the first amplifier output node;
   a first voltage gain transistor having a first conduction terminal coupled to the first amplifier output node, a control terminal coupled to the negative output of the fully differential amplification stage, and a second conduction terminal coupled to a ground node.

8. The fully differential operational amplifier of claim 1, wherein the negative output stage includes:
   a second current source transistor having a first conduction terminal coupled to a voltage source node, a control terminal for receiving a common mode feedback voltage, and a second conduction terminal coupled to the second amplifier output node;
   a second voltage gain transistor having a first conduction terminal coupled to the second amplifier output node, a control terminal coupled to the positive output of the fully differential amplification stage, and a second conduction terminal coupled to a ground node.

9. The fully differential operational amplifier of claim 1, comprising a bias stage having a first input coupled to the second output of the level shifting and amplification stage, a second input coupled to the first output of the level shifting and amplification stage, a first output coupled to the first amplifier output node, and a second output coupled to the second amplifier output node.

10. The fully differential operational amplifier of claim 9, wherein the bias stage includes:
    a first biasing transistor having a first conduction terminal coupled to a voltage supply node, a second conduction terminal coupled to the first amplifier output node, and a control terminal;
    a second biasing transistor having a first conduction terminal coupled to a voltage supply node, and a second conduction terminal and a control terminal that are both coupled to the control terminal of the first biasing transistor; and
    a third biasing transistor having a first conduction terminal coupled to the second conduction terminal of the second biasing transistor, a second conduction terminal coupled to a ground node, and a control terminal coupled to the second output of the level shifting and amplification stage.

11. The fully differential operational amplifier of claim 9, wherein the bias stage includes:
    a fourth biasing transistor having a first conduction terminal coupled to a voltage supply node, a second conduction terminal coupled to the second amplifier output node, and a control terminal;
    a fifth biasing transistor having a first conduction terminal coupled to a voltage supply node, and a second conduction terminal and a control terminal that are both coupled to the control terminal of the fourth biasing transistor; and a sixth biasing transistor having a first conduction terminal coupled to the second conduction terminal of the fifth biasing transistor, a second conduction terminal coupled to a ground node, and a control terminal coupled to the first output of the level shifting and amplification stage.

12. A fully differential operational amplifier, comprising:
a differential input stage having first and second inputs coupled to a positive voltage input node and a negative voltage input node of the fully differential operational amplifier, respectively, and first and second outputs;
an amplification stage having first and second inputs coupled to the first and second outputs of the differential input stage, respectively, and first and second outputs;
a first compensation transistor having a first conduction terminal coupled to the first input of the amplification stage, a control terminal coupled the first output of the amplification stage, and a second conduction terminal;
a second compensation transistor having a first conduction terminal coupled to the second input of the amplification stage, a control terminal coupled the second output of the amplification stage, and a second conduction terminal;
a positive output stage having an input coupled to the second conduction terminal of the first compensation transistor, a first output coupled to a first output of the fully differential operational amplifier, and a second output coupled to first input of the amplification stage, the positive output stage including a first compensation capacitor coupled between the first output of the fully differential operational amplifier and the first input of the amplification stage; and
a negative output stage having an input coupled to the second conduction terminal of the second compensation transistor, a first output coupled to a second output of the fully differential operational amplifier, and a second output coupled to second first input of the amplification stage, the negative output stage including a second compensation capacitor coupled between the first output of the fully differential operational amplifier and the first input of the amplification stage.

13. The fully differential operational amplifier of claim 12, comprising a bias stage having a first input coupled to the second conduction terminal of the second compensation transistor, a second input coupled to the second conduction terminal of the first compensation transistor, a first output coupled to the first output of the fully differential operational amplifier, and a second output coupled to the second output of the fully differential operational amplifier.

14. The fully differential operational amplifier of claim 13, wherein the bias stage includes:
a first biasing transistor having a first conduction terminal coupled to a voltage supply node, a second conduction terminal coupled to the first output of the fully differential operational amplifier, and a control terminal;
a second biasing transistor having a first conduction terminal coupled to a voltage supply node, and a second conduction terminal and a control terminal that are both coupled to the control terminal of the first biasing transistor; and
a third biasing transistor having a first conduction terminal coupled to the second conduction terminal of the second biasing transistor, a second conduction terminal coupled to a ground node, and a control terminal coupled to the second conduction terminal of the second compensation transistor.

15. The fully differential operational amplifier of claim 13, wherein the bias stage includes:
a fourth biasing transistor having a first conduction terminal coupled to a voltage supply node, a second conduction terminal coupled to the second output of the fully differential operational amplifier, and a control terminal;
a fifth biasing transistor having a first conduction terminal coupled to a voltage supply node, and a second conduction terminal and a control terminal that are both coupled to the control terminal of the fourth biasing transistor; and
a sixth biasing transistor having a first conduction terminal coupled to the second conduction terminal of the fifth biasing transistor, a second conduction terminal coupled to a ground node, and a control terminal coupled to the second conduction terminal of the first compensation transistor.

16. A method, comprising:
receiving, by a differential input stage of a differential operational amplifier, a first input signal and a second input signal, and outputting, by the differential input stage, a first intermediary signal and a second intermediary signal based on the first and second input signals;
outputting, by a first and second output stages, a first and second output signals of the differential operational amplifier;
feeding back, by a first and second compensating capacitors, respectively, third and fourth intermediary signals based on the first and second output signals of the differential operational amplifier, respectively;
outputting, by an auxiliary operational amplifier, first and second control signals based on the first, second, third and fourth intermediary signals; and
controlling, using the first and second control signals, the first and second output stages of the differential operational amplifier, respectively.

17. The method of claim 16, wherein outputting the first and second control signals based on the first, second, third, and fourth intermediary signals includes:
receiving the first and third intermediary signals at a positive input of the auxiliary operational amplifier;
receiving the second and fourth intermediary signals at a negative input of the auxiliary operational amplifier;
outputting the first control signal at a negative output of the auxiliary operational amplifier; and
outputting the second control signal at a positive output of the auxiliary operational amplifier.

18. The method of claim 16, wherein controlling the first and second output stage includes:
controlling a first compensating transistor using the first control signal to produce a first compensating transistor output signal;
controlling the first output stage using the first compensating transistor output signal;
controlling a second compensating transistor using the second control signal to produce a second compensating transistor output signal; and
controlling the second output stage using the second compensating transistor output signal.

19. The method of claim 16, wherein the first compensating capacitor is coupled between a first node for providing the first output signal and a positive input of the auxiliary operational amplifier, and the second compensating capacitor is coupled between a second node for providing the second output signal and a negative input of the auxiliary operational amplifier.

20. A fully differential operational amplifier, comprising:
   first and second amplifier input nodes;
   first and second amplifier output nodes;
   a differential input stage having a first input coupled to the first amplifier input node, a second input coupled to the second amplifier input node, a first output coupled to a first intermediary node and a second output coupled to a second intermediary node;
   a level shifting and amplification stage having first and second outputs, the level shifting and amplification stage including:
      a fully differential amplification stage having a positive input coupled to the first intermediary node, a negative input coupled to the second intermediary node, a negative output, and a positive output;
      a first compensation transistor having a first conduction terminal coupled to the first intermediary node, a second conduction terminal coupled to the first output of the level shifting and amplification stage, and a control terminal coupled to the negative output of the fully differential amplification stage; and
      a second compensation transistor having a first conduction terminal coupled to the second intermediary node, a second conduction terminal coupled to the second output of the level shifting and amplification stage, and a control terminal coupled to the positive output of the fully differential amplification stage;
   a positive output stage having an input coupled to first output of the level shifting and amplification stage, and an output coupled to the first amplifier output node;
   a negative output stage having an input coupled to the first output of the level shifting and amplification stage and an output coupled to the second amplifier output node;
   a level shifting stage having, as inputs, the positive input and the negative input of the fully differential amplification stage, the level shifting stage having a first output, and a second output; and
   an amplification stage having a first input coupled to the first output of the level shifting stage, and a second input coupled to the second output of the level shifting stage, the amplification stage having, as outputs, the negative output and the positive output of the fully differential amplification stage.

21. The fully differential operational amplifier of claim 20, wherein the level shifting stage includes:
   a first level shifting transistor having a first conduction terminal coupled to a power supply node, a control terminal coupled to the first intermediary node, and a second conduction terminal; and
   a second level shifting transistor having a first conduction terminal coupled to the second conduction terminal of the first level shifting transistor, a control terminal for receiving a bias voltage, and a second conduction terminal coupled to a ground node.

22. A fully differential operational amplifier, comprising:
   first and second amplifier input nodes;
   first and second amplifier output nodes;
   a differential input stage having a first input coupled to the first amplifier input node, a second input coupled to the second amplifier input node, a first output coupled to a first intermediary node and a second output coupled to a second intermediary node;
   a level shifting and amplification stage having first and second outputs, the level shifting and amplification stage including:
      a fully differential amplification stage having a positive input coupled to the first intermediary node, a negative input coupled to the second intermediary node, a negative output, and a positive output;
      a first compensation transistor having a first conduction terminal coupled to the first intermediary node, a second conduction terminal coupled to the first output of the level shifting and amplification stage, and a control terminal coupled to the negative output of the fully differential amplification stage; and
      a second compensation transistor having a first conduction terminal coupled to the second intermediary node, a second conduction terminal coupled to the second output of the level shifting and amplification stage, and a control terminal coupled to the positive output of the fully differential amplification stage;
   a positive output stage having an input coupled to first output of the level shifting and amplification stage, and an output coupled to the first amplifier output node;
   a negative output stage having an input coupled to the first output of the level shifting and amplification stage and an output coupled to the second amplifier output node; and
   a bias stage having a first input coupled to the second output of the level shifting and amplification stage, a second input coupled to the first output of the level shifting and amplification stage, a first output coupled to the first amplifier output node, and a second output coupled to the second amplifier output node.

23. The fully differential operational amplifier of claim 22, wherein the fully differential amplification stage includes:
   a level shifting stage having, as inputs, the positive input and the negative input of the fully differential amplification stage, the level shifting stage having a first output, and a second output;
   an amplification stage having a first input coupled to the first output of the level shifting stage, and a second input coupled to the second output of the level shifting stage, the amplification stage having, as outputs, the negative output and the positive output of the fully differential amplification stage.

24. A fully differential operational amplifier, comprising:
   a differential input stage having first and second inputs coupled to a positive voltage input node and a negative voltage input node of the fully differential operational amplifier, respectively, and first and second outputs;
   an amplification stage having first and second inputs coupled to the first and second outputs of the differential input stage, respectively, and first and second outputs;
   a first compensation transistor having a first conduction terminal coupled to the first input of the amplification stage, a control terminal coupled the first output of the amplification stage, and a second conduction terminal;
   a second compensation transistor having a first conduction terminal coupled to the second input of the amplification stage, a control terminal coupled the second output of the amplification stage, and a second conduction terminal; and
   a bias stage having a first input coupled to the second conduction terminal of the second compensation transistor, a second input coupled to the second conduction terminal of the first compensation transistor, a first output coupled to a first output of the fully differential operational amplifier, and a second output coupled to a second output of the fully differential operational amplifier.

25. The fully differential operational amplifier of claim 24, wherein the bias stage includes:
a first biasing transistor having a first conduction terminal coupled to a voltage supply node, a second conduction terminal coupled to the first output of the fully differential operational amplifier, and a control terminal;
a second biasing transistor having a first conduction terminal coupled to a voltage supply node, and a second conduction terminal and a control terminal that are both coupled to the control terminal of the first biasing transistor; and
a third biasing transistor having a first conduction terminal coupled to the second conduction terminal of the second biasing transistor, a second conduction terminal coupled to a ground node, and a control terminal coupled to the second conduction terminal of the second compensation transistor.

* * * * *